(12) United States Patent
Chen et al.

(10) Patent No.: US 11,264,212 B1
(45) Date of Patent: Mar. 1, 2022

(54) ION ANGLE DETECTOR

(71) Applicant: Tokyo Electron Limited, Tokyo (JP)

(72) Inventors: Zhiying Chen, Austin, TX (US); Joel Blakeney, Austin, TX (US); Megan Carruth, Austin, TX (US); Peter Ventzek, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 16 days.

(21) Appl. No.: 17/037,025

(22) Filed: Sep. 29, 2020

(51) Int. Cl.
*H01J 49/36* (2006.01)
*H01J 37/32* (2006.01)
*H01J 37/08* (2006.01)

(52) U.S. Cl.
CPC ........ *H01J 37/32412* (2013.01); *H01J 37/08* (2013.01); *H01J 37/32935* (2013.01); *H01J 2237/3365* (2013.01)

(58) Field of Classification Search
USPC .................................................. 250/492.21
See application file for complete search history.

(56) References Cited

U.S. PATENT DOCUMENTS

| | | | | |
|---|---|---|---|---|
| 4,574,179 | A * | 3/1986 | Masuzawa | H01J 37/08 204/192.34 |
| 5,451,784 | A | 9/1995 | Loewenhardt et al. | |
| 5,565,681 | A | 10/1996 | Loewenhardt et al. | |
| 6,828,730 | B2 * | 12/2004 | Eden | H01J 47/00 313/538 |
| 7,026,628 | B2 * | 4/2006 | Krueger | H01J 37/244 250/397 |
| 7,777,179 | B2 | 8/2010 | Chen et al. | |
| 7,867,409 | B2 | 1/2011 | Brcka | |
| 7,875,859 | B2 | 1/2011 | Chen et al. | |
| 8,409,398 | B2 | 4/2013 | Brcka | |
| 8,816,281 | B2 | 8/2014 | Funk et al. | |
| 8,847,159 | B2 | 9/2014 | Chen et al. | |
| 9,087,677 | B2 | 7/2015 | Funk et al. | |
| 9,147,777 | B2 * | 9/2015 | Bui | H01L 31/022416 |
| 9,768,003 | B2 * | 9/2017 | Deerberg | H01J 49/025 |
| 10,608,173 | B2 * | 3/2020 | Lee | H01L 43/12 |
| 2008/0032427 | A1 | 2/2008 | Lee et al. | |
| 2010/0159120 | A1 | 6/2010 | Dzengeleski et al. | |
| 2015/0160557 | A1 | 6/2015 | Devilliers | |
| 2019/0318913 | A1 | 10/2019 | Yoshida et al. | |
| 2019/0318916 | A1 | 10/2019 | Yoshida et al. | |

FOREIGN PATENT DOCUMENTS

JP 2004235090 A 8/2004

OTHER PUBLICATIONS

Gahan, D. et al., "Retarding field analyzer for ion energy distribution measurements at a radio-frequency biased electrode," Review of Scientific Instruments, 79, 033502, Mar. 10, 2008, 10 pages.
Woodworth, J.R., et al., "Experimental and theoretical study of ion distributions near 300 um Tall Steps on rf-biased wafers in high density plasmas," Dec. 9, 2002, 9 pages.

* cited by examiner

*Primary Examiner* — Phillip A Johnston
(74) *Attorney, Agent, or Firm* — Slater Matsil, LLP

(57) ABSTRACT

A measurement system for a plasma processing system includes a detector and an ion current meter coupled to the ion current collector and configured to provide a signal based on the measurements from the ion current collector. The detector includes an insulating substrate including a cavity, an ion angle selection grid configured to be exposed to a bulk plasma disposed in an upper portion of the cavity, and an ion current collector disposed within the cavity at an opposite side of the cavity below the ion angle selection grid. The ion angle selection grid includes an ion angle selection substrate and a plurality of through openings extending through the ion angle selection substrate, where each of the plurality of through openings has a depth into the ion angle selection substrate and a width orthogonal to the depth, where a ratio of the depth to the width is greater than or equal to 40.

20 Claims, 7 Drawing Sheets

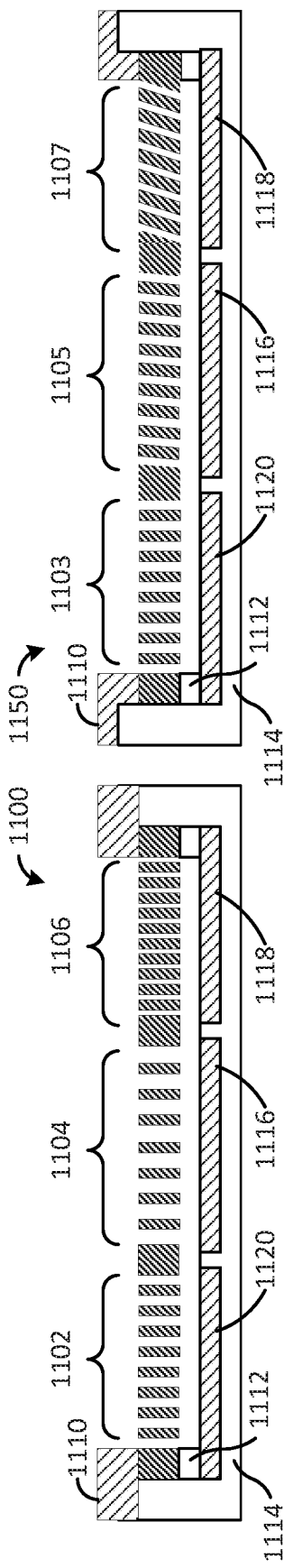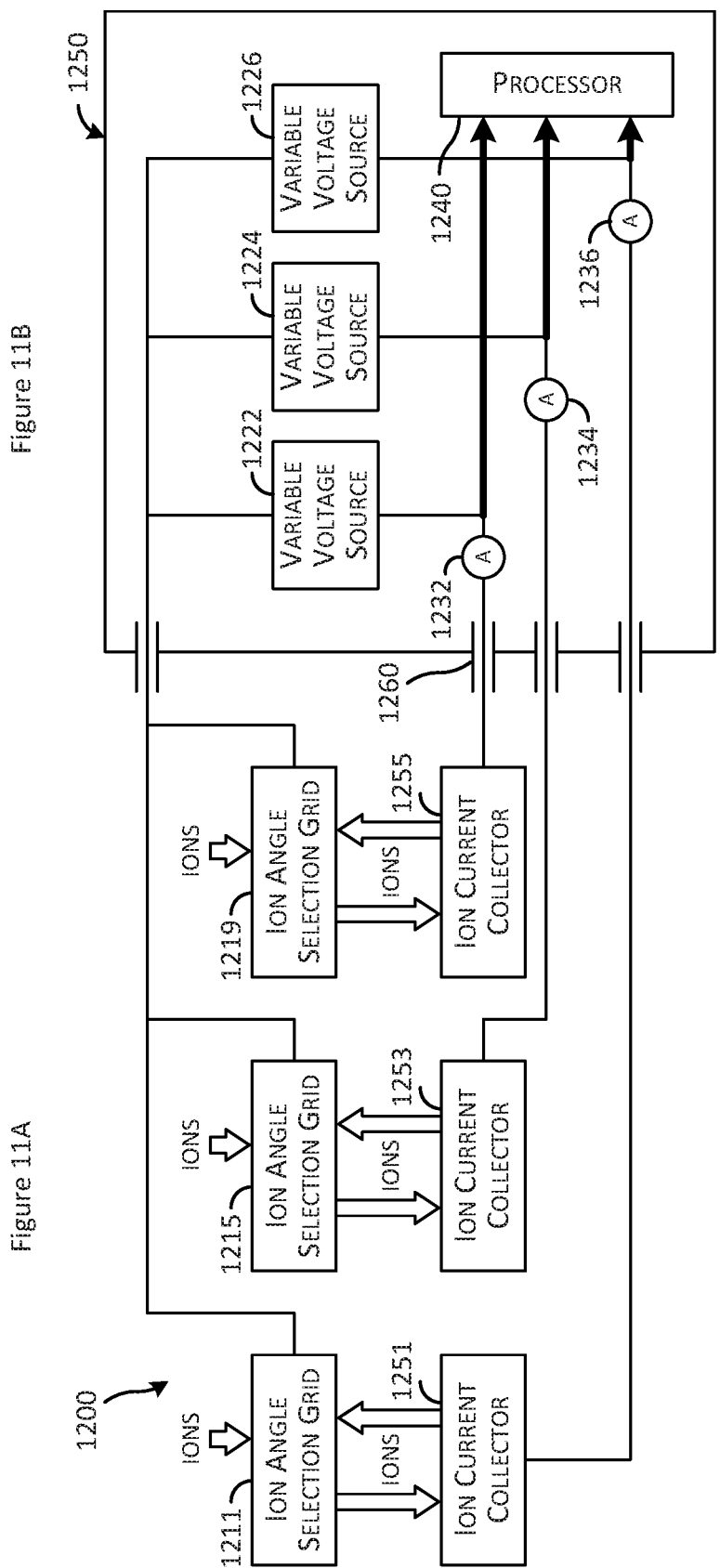

ION ANGLE DETECTOR

TECHNICAL FIELD

The present invention relates generally to a measurement system and method used in plasma processing systems, and, in particular embodiments, to a system and method for detection of ion angle of plasma within a plasma processing system.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes. Plasma processing techniques include chemical dry etching (CDE) (e.g., plasma ashing), physical or sputter etching, reactive ion etching (RIE), plasma-enhanced chemical vapor deposition (PECVD), plasma-enhanced atomic layer etch (PEALE), and atomic layer deposition (PEALD).

At each successive technology node, the minimum feature sizes are shrunk to reduce cost by roughly doubling the component packing density. The demand for low cost electronics with high functionality has driven innovations in patterning complex three dimensional (3D) device structures with feature sizes down to a few nanometers. With lateral dimensions approaching the scale of molecules and atoms, plasma technology faces the challenge of fabricating very high aspect ratio structures with processes that can also meet the stringent precision, uniformity, stability, and repeatability required for IC manufacturing. An increasing number of IC designs, such as nonvolatile flash memory and dynamic random access memory, are adopting high density 3D structures for volume manufacturing that may require precise control, at almost atomic dimensions. Plasma processes such as high aspect ratio contact (HARC) etch and PEALE are sensitive to kinetic energy and direction of ions during processing and the precision of the etch process rely on a narrow distribution of ion energy and ion angle. Precise measurements of these plasma properties have to be made, for which further innovations in detectors and detection methods for ion energy and ion angle distribution functions (IEDF and IADF) remain to be made.

SUMMARY

In accordance with an embodiment of the present disclosure, a measurement system for a plasma processing system includes a detector and an ion current meter coupled to the ion current collector and configured to provide a signal based on the measurements from the ion current collector. The detector includes an insulating substrate including a cavity, an ion angle selection grid configured to be exposed to a bulk plasma disposed in an upper portion of the cavity, and an ion current collector disposed within the cavity at an opposite side of the cavity below the ion angle selection grid. The ion angle selection grid includes an ion angle selection substrate and a plurality of through openings extending through the ion angle selection substrate, where each of the plurality of through openings has a depth into the ion angle selection substrate and a width orthogonal to the depth, where a ratio of the depth to the width is greater than or equal to 40.

In accordance with an embodiment of the present disclosure, a measurement system for a plasma processing system includes a detector and an ion current sensing circuit. The detector includes an insulating substrate including a cavity, a plurality of ion current collectors disposed in a bottom portion of the cavity, and an ion angle selection grid configured to be exposed to a plasma disposed within the cavity at an opposite side of the cavity above the plurality of ion current collectors. The ion angle selection grid includes an ion angle selection substrate and a plurality of through openings extending through the ion angle selection substrate, the plurality of through openings including a first opening disposed over a first collector of the plurality of ion current collectors and a second opening disposed over a second collector of the plurality of ion current collectors, the first opening having a different dimension than the second opening, where each of the plurality of through openings have a depth into the ion angle selection substrate and a width orthogonal to the depth, where a ratio of the depth to the width is greater than or equal to 40. The ion current sensing circuit is coupled to the plurality of ion current collectors and configured to provide a signal representative of an ion angle distribution function of the plasma.

In accordance with an embodiment of the present disclosure, a method of measuring an ion angle distribution of a plasma in a plasma processing system includes placing a detector within a plasma chamber of a plasma processing system, the detector includes a plurality of ion current collectors and an ion angle selection grid, the ion angle selection grid includes an ion angle selection substrate and a plurality of through openings extending through the ion angle selection substrate, the plurality of through openings including a first opening disposed over a first collector of the plurality of ion current collectors and a second opening disposed over a second collector of the plurality of ion current collectors, the first opening having a different dimension than the second opening, where each of the plurality of through openings has a depth into the ion angle selection substrate and a width orthogonal to the depth, where a ratio of the depth to the width is greater than or equal to 40; powering the plasma processing system to sustain a plasma within the plasma chamber; and measuring a current distribution at each of the plurality of ion current collectors by exposing the ion angle selection grid to the plasma; sensing the potential of the ion angle selection grid as a reference voltage; biasing the plurality of ion current collectors to a first voltage relative to the reference voltage; and measuring an ion current at each of the plurality of ion current collectors.

BRIEF DESCRIPTION OF THE DRAWINGS

For a more complete understanding of the present invention, and the advantages thereof, reference is now made to the following descriptions taken in conjunction with the accompanying drawings, in which:

FIG. 11A illustrates a cross-sectional view of a two-layer detector comprising a composite ion angle selection grid, in accordance with an embodiment of the invention;

FIG. 11B illustrates a cross-sectional view of a two-layer detector comprising a composite ion angle selection grid, in accordance with another embodiment of the invention; and FIG. 12 illustrates a schematic representation of a two-layer detector comprising a composite ion angle selection grid with a detector electronic system configured to operate the two-layer detector comprising a composite ion angle selection grid.

DETAILED DESCRIPTION OF ILLUSTRATIVE EMBODIMENTS

The disclosure describes embodiments of integrated ion angle and energy detectors for ions in plasma in a plasma processing system. Ion angle is the angle formed by the ion trajectory and a line normal to a major surface exposed to plasma for processing. Properties of anisotropic plasma processes, such as sidewall profile, etch selectivity, etch rate, nonuniformity of etch rate (e.g., loading effects), and residue control are affected not only by the distribution of ion energy but also by its directionality characterized by an ion angle. High aspect ratio contact (HARC) etch, for example, may be using a very narrow ion angle distribution around zero degree (vertical ion trajectory) to form via holes having an aspect ratio of about 50 or higher (e.g., 20 nm in diameter and about a micron or more deep). The significance of ion distribution to plasma processing underscores the importance of measuring the angle-energy joint distribution function of ions in plasma within a plasma process chamber.

The integrated ion angle and energy detectors described in this disclosure are designed to provide measurements that may be analyzed by a processor to compute the two-dimensional (2D) joint ion distribution function. The detectors may be configured to sample ions in a narrow range of ion angle around a first selected angle and a respective first ion energy distribution function (IEDF) is extracted using an energy selection technique. A second IEDF may be obtained from a sample of ions in a range of angles around a second selected angle. By selecting a plurality of such ion angles and obtaining the respective plurality of IEDF's, the 2D angle-energy joint distribution function spanning a desired angle-energy space may be constructed. Various methods for varying the ion angle selection have been used in various embodiments, as described in this disclosure.

In order to obtain the ion energy distribution function, an ion energy selection technique has to be applied to create a subsample of ions in a selected range of ion energies. The IEDF may then be extracted by varying the selected energy range and measuring the respective detector response. The energy selection techniques used for the embodiments in this disclosure are designed to operate similar to those used in the ion energy analyzers described in U.S. Pat. Nos. 7,875,859, 7,777,179, and 8,847,159 (all of which are incorporated herein by reference).

Figure 1:
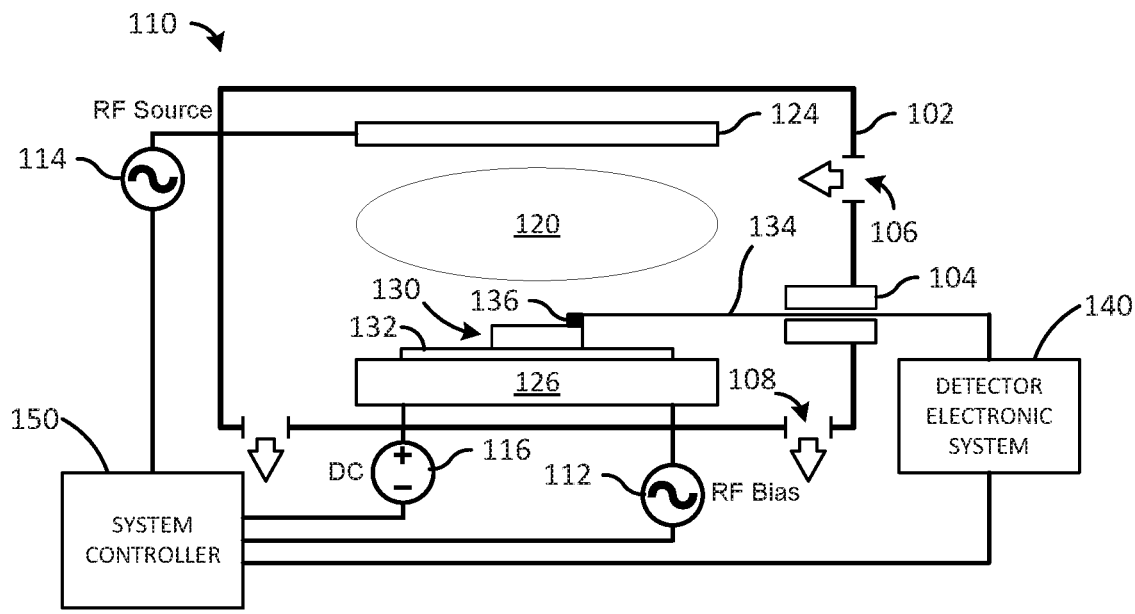
FIG. 1 illustrates a schematic cross-sectional view of a plasma processing system equipped with a detector, in accordance with an embodiment of the invention.

In this disclosure, we first refer to FIG. 1 to illustrate an example plasma system equipped with a detector. The structure of the integrated ion angle and energy detectors is then explained by describing one embodiment with reference to FIGS. 2 through 4B. The method of operating a simple example detector to select an angle range and obtain the respective IEDF is described with reference to FIGS. 5 through 6B, and the method for another embodiment of the integrated angle and energy detector based on the first example is illustrated using FIGS. 7 through 8B.

Next the structures and methods used in varying the selected ion angle are described. There are two categories of methods for changing the selected angle: a first category that involves physical rotation, and a second category, wherein multiple angle selectors are deployed. Embodiments in the first category are described with reference to FIGS. 9A-9C, and embodiments in the second category are described with reference to FIG. 10 through 12.

Referring now to FIG. 1, a schematic cross-sectional view of an example plasma processing system 110 is illustrated, where a detector 130 is shown located on a semiconductor wafer 132 loaded on a substrate holder 126 inside a plasma process chamber 102. The plasma process chamber 102, in this example, is configured as a capacitively coupled plasma (CCP) chamber. Plasma 120 is shown sustained between two disc shaped electrodes. A top electrode 124 is shown coupled to a radio frequency (RF) source power source 114 and the substrate holder 126 doubles as a bottom electrode. In the example plasma processing system 110, the substrate holder 126 is coupled to an RF bias power source 112 and a DC or a pulsed DC power source 116. The various electrical power sources may be controlled by a system controller 150 to provide electrical power and bias voltages to the respective electrodes or be disabled, in accordance with a process recipe. Various gaseous mixtures may be introduced in the plasma process chamber 102 through gas inlets such as a gas inlet 106, illustrated in FIG. 1. During operation, a gas flow system comprising vacuum pumps and control valves may maintain a gas flow over the semiconductor wafer 132, and gaseous byproducts may be removed from the plasma process chamber 102 through gas outlets 108, as illustrated in FIG. 1. The gas flow system may also be controlled by the system controller 150.

As illustrated schematically in FIG. 1, the detector 130 is coupled to a detector electronic system 140 using connectors 136 and conductive wires 134 going through a wall of the plasma process chamber 102 using a vacuum feedthrough 104. The detector electronic system comprises a processor controlling various voltage sources for configuring the detector, receiving electric current and potential from the detector and measured by sensing circuits, storing and analyzing the measurements to construct the joint angle-energy distribution function, and communicating the information to the system controller 150 using electronic signals through direct connection or by wireless.

Figure 2:
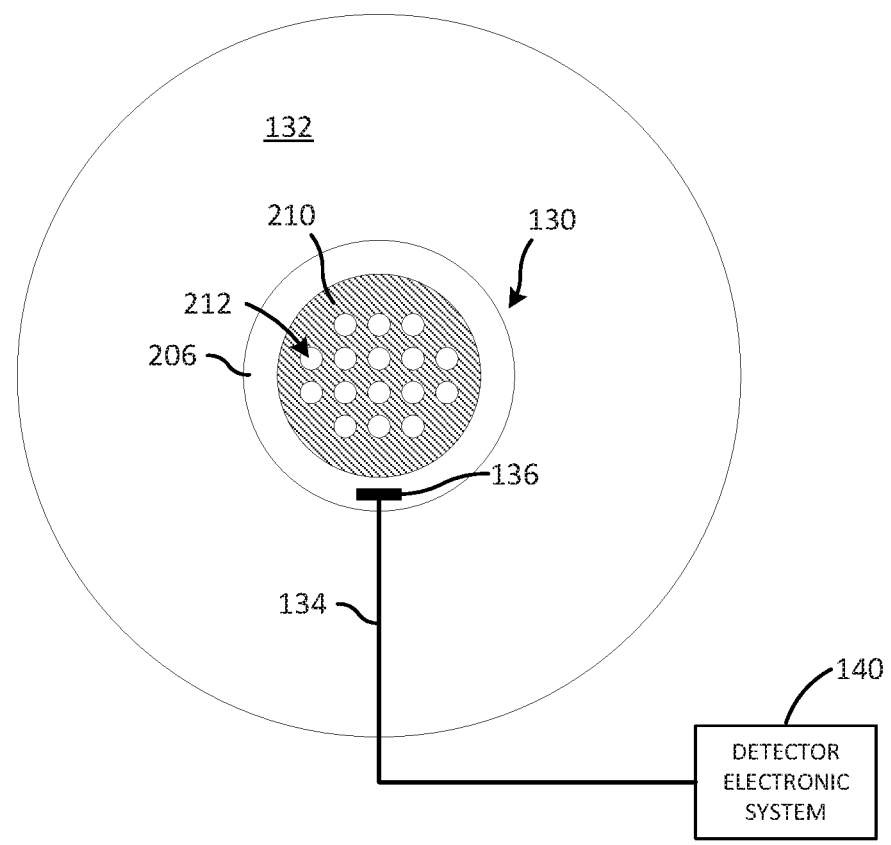
FIG. 2 illustrates a schematic planar view of a semiconductor wafer including a detector, in accordance with an embodiment of the invention.

FIG. 2 illustrates a top planar view of the detector 130 placed on the semiconductor wafer 132. The semiconductor wafer 132 may be a diagnostic wafer or a product wafer exposed to plasma 120 for processing. The top view of the detector 130 comprises a conductive ring 206 with a central opening shaped like a circle. As shown in subsequent cross-sectional views, the conductive ring 206 with the central opening is disposed over an insulating substrate comprising a cavity. Spanning across the central opening is shown an ion angle selection grid 210 having high aspect ratio openings 212 through which ions may enter the cavity in the substrate below. The example in FIG. 2 shows high aspect ratio openings 212, e.g., shaped like a circle. However, it is understood that various other geometries may be used. The connectors 136 are shown schematically located over the conductive ring 206 near its edge. The conductive wires 134 couple the connectors 136 to the detector electronic system 140.

Although the detector 130, illustrated in FIGS. 1 and 2, is shown disposed over the surface of the semiconductor wafer 132 near its center, it is understood that the detector may be disposed at another location of the surface, for example, near the edge of the semiconductor wafer 132); on a bottom wall of a cavity in the semiconductor wafer 132; or over some other surface exposed to the plasma 120, for example, the surface of the substrate holder 126.

Figure 3:
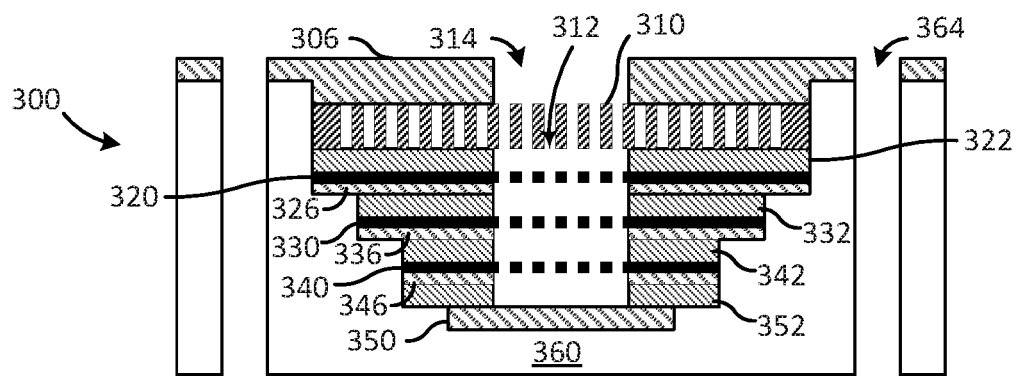
FIG. 3 illustrates a cross-sectional view of a five-layer detector, in accordance with an embodiment of the invention.

FIG. 3 illustrates a cross-sectional view of a five-layer detector 300. The five-layer detector 300 comprises five conductive tiers inside a cavity of an insulating substrate 360. The bottom conductive tier, in the example detector in FIG. 3, is a conductive plate shaped like a disc, which is the ion current collector 350. The topmost conductive tier, exposed to plasma during operation, comprises a top conductive ring 306 and a conductive ion angle selection grid 310 spanning across the central opening 314, and disposed adjacent below the top conductive ring 306. The ion angle selection grid 310 comprises high aspect ratio openings 312 extending through the substrate of the ion angle selection grid 310. The aspect ratio of a through opening is defined herein as the ratio of a depth into the substrate to a width of the high aspect ratio openings 312 orthogonal to the depth direction. The top conductive ring 306 and the conductive ion angle selection grid 310 are in physical and electrical contact with each other.

The three conductive tiers between the ion angle selection grid 310 and the ion current collector 350 comprises three conductive grids, each grid being in electrical contact with and supported from below by a conductive ring. As illustrated in FIG. 3, a first and a second electron rejection grid 320 and 340, adjacent above respective conductive rings 326 and 346, are positioned above and below an ion energy selection grid 330, respectively. Conductive ring 336 is adjacent below the ion energy selection grid 330. The five conductive tiers of the five-layer detector are electrically isolated from each other by four insulating rings 322, 332, 342, and 352, and the insulating substrate 360.

In various embodiments, the top conductive ring 306 comprises stainless steel, tungsten, molybdenum, or other metal, of thickness about 0.1 mm to about 1 mm; the ion angle selection grid 310 substrate comprises stainless steel, tungsten, molybdenum, or other metal, of thickness about 0.2 mm to about 1 mm; the ion current collector 350 comprises stainless steel, tungsten, molybdenum, or some other suitable metal, of thickness about 0.1 mm to about 1 mm; and the insulating substrate 360 comprises a ceramic, quartz, vespel, or polyimide. Since it is undesirable for the measurement to disturb the plasma potential, the widths of high aspect ratio openings 312 in the ion angle selection grid 310 are designed to be less than the Debye length of the plasma. In various embodiments, the width may be 5 m to 100 m. The width of the central opening 314 may be about 5 mm to about 10 mm. The central opening 314 extends vertically from the top of the top conductive ring 306 to the top of the ion current collector 350. However, because of the high aspect ratio of the high aspect ratio openings 312, the depth of the central opening 314 may be dominated by the thickness of the ion angle selection grid 310.

The thicknesses of the various layers of a detector have been designed to be thin because it is advantageous to keep the height of the detector, such as the five-layer detector 300, small in order to, for example, place the detector in a cavity of a semiconductor wafer. However, it is understood that, in some other embodiments, thicker layers may be used, as needed.

The substrates of the ion energy selection grid 330 and the first and second electron rejection grids 320 and 340 comprise stainless steel, tungsten, molybdenum, or other metal, of thickness about 0.1 mm to about 1 mm; and the three conductive rings 326, 336, and 346 comprise stainless steel, tungsten, molybdenum, or some other suitable metal, of thickness about 0.1 mm to about 1 mm. The four insulating rings 322, 332, 342, and 352 comprise ceramic, quartz, vespel, or polyimide, of thickness about 0.1 mm to about 1 mm.

In operation, the ion angle selection grid 310 of the five-layer detector 300 is the entrance grid through which the ions from the plasma are sampled for the measurement. Because of the high aspect ratio of the high aspect ratio openings 312 at the entrance of the detector, only the ions with trajectories directed in a narrow window around a selected ion angle are able to pass through. In the example embodiment in FIG. 3, the high aspect ratio openings 312 are oriented vertically. Accordingly, the selected ion angle is zero degree, and a window of about 1° may be achieved with an aspect ratio of 50. The width of the band of ion angles around 0° is roughly inversely proportional to the reciprocal of the aspect ratio of high aspect ratio openings 312.

Positively charged ions from plasma enter the five-layer detector 300 through the central opening 314 and the high aspect ratio openings 312 of the ion angle selection grid 310. However, in some plasma processing techniques, electrons may be directed towards the substrate holder and enter the five-layer detector 300 along with the ions. For example, in direct current superposition (DCS) plasma processing, negative DC bias is applied to a top electrode of a CCP chamber comprising silicon or metal to sputter coat a layer (e.g., a photoresist layer over a semiconductor wafer) using argon or nitrogen ions. Secondary electron emission, generated by the sputtering process and repelled by the negative DC bias, may form a flux of ballistic electrons directed towards the substrate holder. Secondary electron emission also occurs inside the detector 300 as ions from plasma collide with the various grids and rings present in the cavity of the insulating substrate 360. The electrons are a source of noise for the measurement. The first and second electron rejection grids 320 and 340 may be configured using bias voltages to repel negative charge, thereby rejecting the unwanted electron flux inside the five-layer detector 300.

The energy distribution of the sample of ions that fall within the narrow angle window to be able to pass through the ion angle selection grid is measured by using an energy selection technique explained in detail in U.S. Pat. Nos. 7,875,859, 7,777,179, and 8,847,159 (all of which are incorporated herein by reference). In the five-layer detector 300, the ion energy selection grid 330 may be configured to select a subsample of ions above a selected energy from the sample of ions selected by the ion angle selection grid 310. The ion energy selection grid 330 may be biased using a variable bias voltage. The bias may be changed in steps or a continuous ramp, or by using a waveform, for example, a triangular or a sinusoidal waveform. Ions of all energies may pass through when the ion energy selection grid 330 bias attracts positive ions but, for a bias that repels ions, the ions below a respective energy threshold are blocked from reaching the ion current collector 350. The ion current waveform in response to the energy selection grid bias waveform is sensed and stored in a detector electronic system (e.g., the detector electronic system 140 in FIG. 1). The change in ion current with respect to a change in bias voltage provides a measure of the ion flux at the energy selected by the repelling bias of the ion energy selection grid 330. Accordingly, the acquired ion current waveform may be differentiated with respect to the energy selection grid voltage by a programmable processor to obtain a measurement for the IEDF of the sample of ions at the selected ion angle.

The net flux of ions entering the five-layer detector 300 through the two selection grids (the ion angle selection grid 310 and the ion energy selection grid 330) may be observed by measuring the respective arrival rate of ions at the ion current collector 350. The ions present in plasma are predominantly positively charged particles, and the ion current collector 350 may be configured to attract positive charge. With the ion current collector 350 configured to attract positive charge from the plasma passing through the topmost conductive tier, any positive ion reaching the surface of the ion current collector 350 would invariably recombine there to generate an ion current directly proportional to the ion arrival rate. The measurement is based on sensing the collected ion current to provide a measure of the fraction of ions selected by the high aspect ratio openings in the ion angle selection grid. A calibration or normalization to the ion current representative of the total ion flux may be done, as described below.

The ion current increases as less positive bias voltage is applied to the ion energy selection ring 330 because more of the lower energy ions are able to pass through and get collected by a negatively biased ion current collector 350. As explained above, when the bias voltage on the ion energy selection ring 330 crosses over from positive to negative polarity then all the ions entering through the ion angle selection grid 310 get collected by the ion current collector 350. Thus, beyond a certain bias the collected ion current may saturate, and this saturation ion current may be used to represent the portion of the 2D joint ion distribution function that falls within the range of ion angles selected by the ion angle selection grid 310. In some embodiments, the collector doubles as the ion energy selector, as described in further detail below with reference to FIG. 5 and, in such embodiments, the saturation ion current at negative collector bias may be used to represent the portion of the 2D joint ion distribution function that falls within the range of ion angles selected by the ion angle selection grid 310.

The normalization over all possible ion angles may be done by normalizing an ion current measurement with a respective measurement performed using a control detector that allows ions having all possible ion angles to pass through. For example, the control detector may be an ion detector designed with the same grids, except the control detector may be having a very low aspect ratio ion angle selector grid, or the entire central hole as its opening. The measured ion current is directly proportional to an area of transparency of the ion detector, defined as the common area of the openings of the set of grids (grids 310, 320, 330, and 340) in the line of sight of the ion current collector 350. Accordingly, for each of the two detectors (the control detector and the detector with a high aspect ratio ion angle selection grid), the respective grid openings of the grids 310, 320, 330, and 340 may be aligned, or, if they are not aligned then the measured ion current may be corrected for the difference between the areas of transparency. Generally, the width of grid openings may be designed to allow for some misalignment, with the narrowest openings being in the topmost ion angle selection grid 310, and the openings widened successively, with the widest openings being in the second electron rejection grid 340. If the grids 320, 330, and 340 are properly aligned to the ion angle selection grid 310 then the area of transparency may be calculated from the designed dimensions of the grid openings and the ion current may be normalized accordingly.

The fabrication, assembly, and alignment of multiple grid detectors are explained in U.S. Pat. No. 8,847,159 (incorporated herein by reference) and, as explained therein, may utilize various technologies such as microelectromechanical systems (MEMS), laser drilling, electrical discharge machining (EDM), electron-beam machining, and the like. After alignment, the aligned structure may be secured by fasteners such as ceramic nuts and bolts positioned in the fastener-holes 364, illustrated in FIG. 3. In some embodiments, as mentioned above, an alignment of grid openings may not be performed.

In order to make a correction to the measured ion current of a multi-layer ion angle detector, such as the five-layer detector 300, for the discrepancy in its area of transparency relative to that of the control detector, a ratio of the areas of transparency may be measured. For example, both detectors may be exposed to equal intensities of incident light and a ratio of the intensities of the respective transmitted light be used as a measure of the ratio of the respective areas of transparency.

Figure 4A:
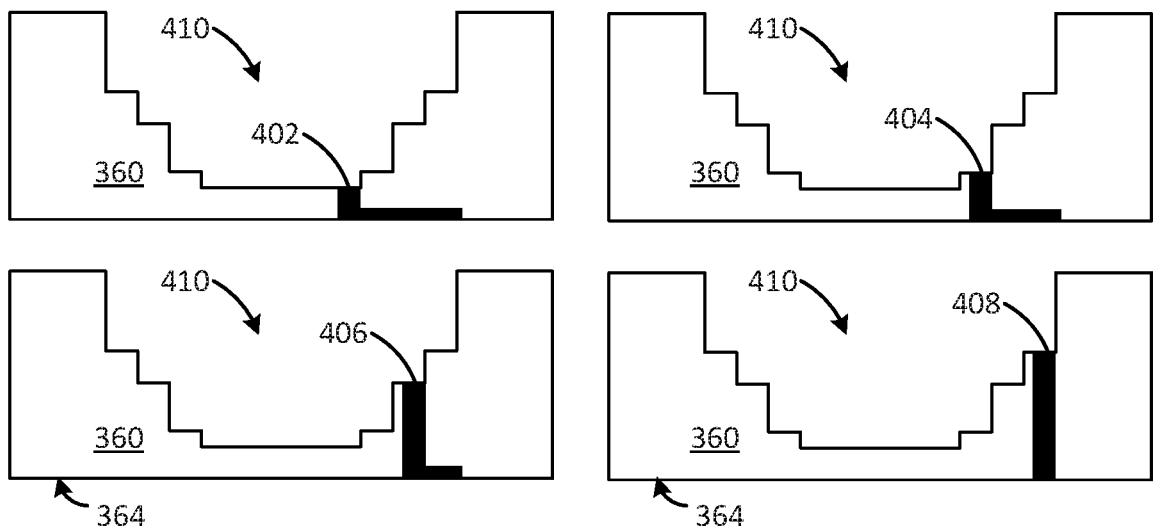
FIG. 4A illustrates schematic cross-sectional views of contacts embedded in the five-layer detector illustrated in FIG. 3.
Figure 4B:
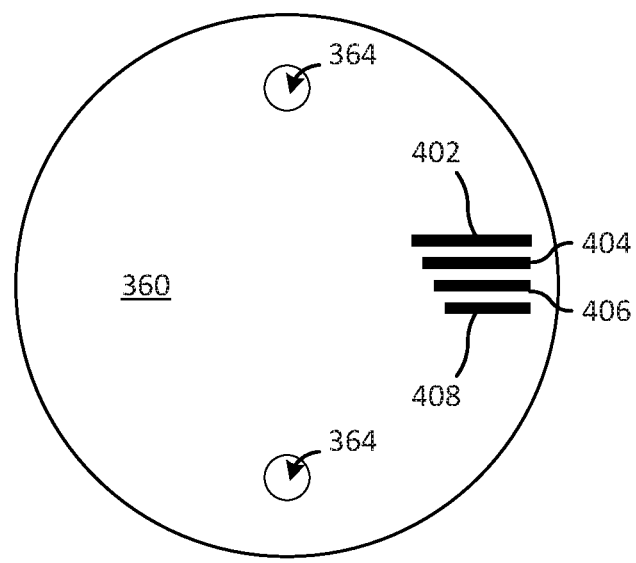
FIG. 4B illustrates a schematic planar view of the five-layer detector with embedded contacts illustrated in FIG. 4A.

FIG. 4A illustrates cross-sectional views and FIG. 4B illustrates the respective top planar view showing conductive channels 402, 404, 406, and 408 embedded in the insulating substrate 360. The various conductive and insulating components of the five-layer detector 300 are not shown for clarity. The conductive channels 402, 404, 406, and 408 may be used to make electrical contacts to four conductive tiers of the five-layer detector 300 (illustrated in FIG. 3). The four conductive tiers would be those disposed in the cavity 410 of the insulating substrate 360 below the ion angle selection grid 310, as illustrated in FIG. 3. As shown in FIG. 3, the ion angle selection grid 310 is coupled to the top conductive ring 306. Since the surface of the top conductive ring 306 is exposed, an electrical connection to the ion angle selection grid 310 may be made by contacting the exposed conductive surface of the top conductive ring 306. Contacts to the other conductive tiers are made by drilling holes in the insulating substrate and inserting conductive elements there. The conductive elements comprise metal wires, metal springs, or deposited metal. As illustrated in the top-left cross-sectional view in FIG. 4A, a conductive channel 402 inserted in the insulating substrate 360 may be used to contact the ion current collector 350. Likewise, in different cross-sections, conductive channels 404 and 408 may be used to contact the second and the first electron rejection grid, respectively. Another conductive channel 406 may make electrical contact to the ion energy selection grid 330.

The schematic top view illustrated in FIG. 4B shows the four conductive channels 402, 404, 406, and 408 at the surface where they may be coupled to connectors and conductive wires to electrically communicate with the detector electronic system 140, shown in FIGS. 1 and 2. The structure shown in FIG. 4B is same as that shown in FIG. 4A. The fastener-holes 364 are visible in the top view in FIG. 4B.

Figure 5:
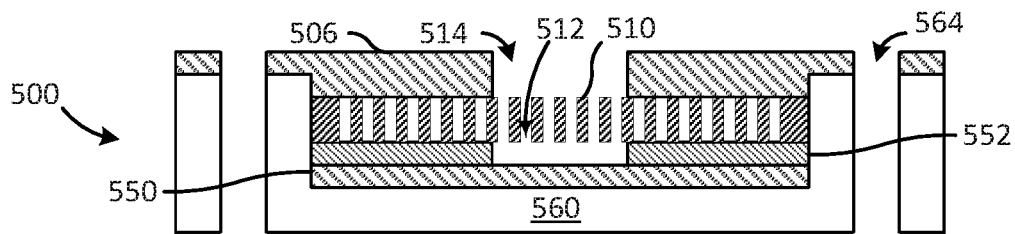
FIG. 5 illustrates a cross-sectional view of a two-layer detector, in accordance with an embodiment of the invention.

FIG. 5 illustrates a cross-sectional view of a two-layer detector 500. The two-layer detector 500 is a simplified version of the five-layer detector 300 illustrated in FIG. 3. In the two-layer detector 500, the ion current collector 550 doubles as the ion energy selection grid 330 of five-layer detector 300. One advantage of simplifying the multi-grid structure of a five-layer detector to that of the two-layer detector 500 is that the complexity of grid alignment has been eliminated. The structure of the other components, such as the ion angle selection grid 510 with the high aspect ratio openings 512, the conductive and insulating rings 506 and 552, the central opening 514 of the rings, and the fasteners openings 564, are similar to the respective components in the five-layer detector 300.

Figure 6A:
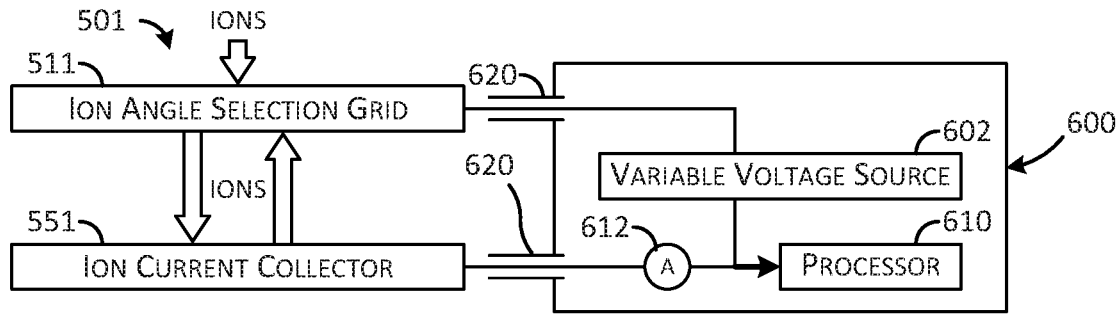
FIG. 6A illustrates a schematic representation of a two-layer detector with a detector electronic system configured to operate the two-layer detector, in accordance with an embodiment of the invention.
Figure 6B:
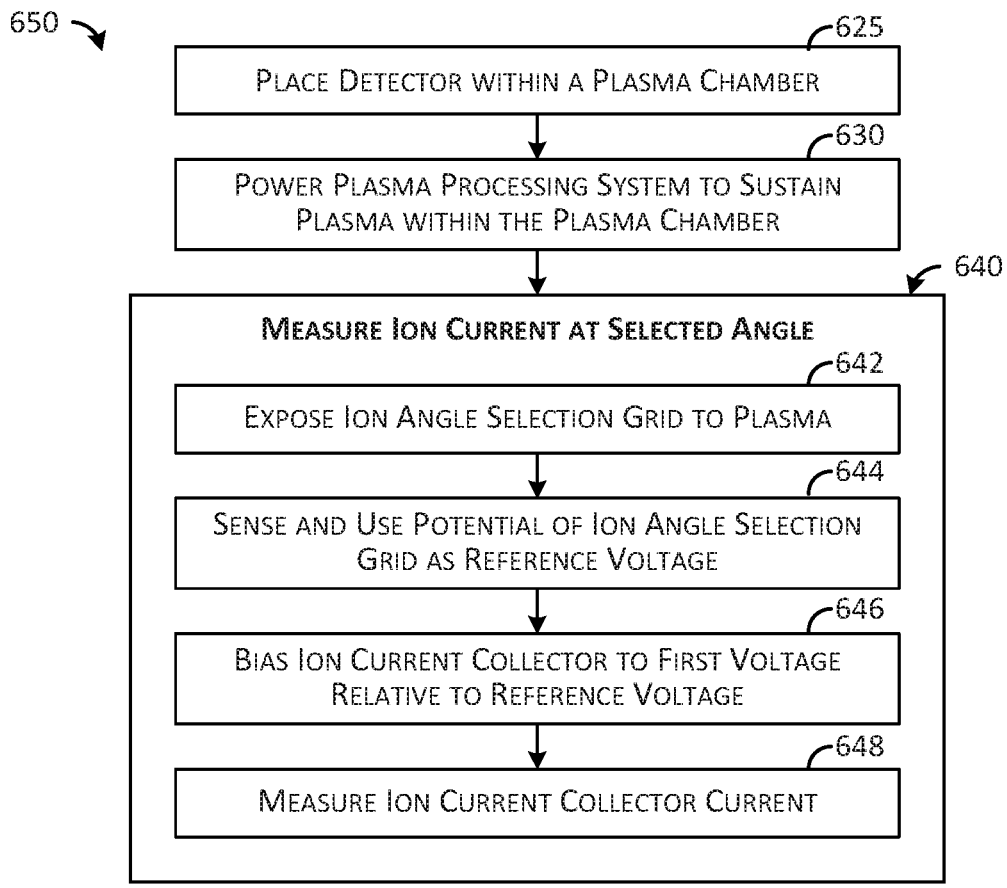
FIG. 6B is a flow diagram illustrating a method for operating the two-layer detector with the detector electronic system illustrated in FIG. 6A.

FIG. 6A shows a two-layer detector 501, which is a schematic representation of the two-layer detector 500 (see FIG. 5), along with a schematic representation of a detector electronic system 600 configured to operate the two-layer detector 501. In FIG. 6B, a flow diagram is shown of a method of operation 650 for operating the two-layer detector 501 with the detector electronic system 600.

Referring to FIGS. 6A and 6B, the method starts with placing the detector on a surface within a plasma chamber that would be exposed to plasma, followed by powering the plasma processing system to sustain plasma within the plasma chamber, as indicated in blocks 625 and 630 of the flow diagram of the method of operation 650. After the plasma has stabilized, a measurement of ion current may be performed using the two-layer detector 501 and the detector electronic system 600 by following the steps indicated in block 640 in FIG. 6B.

With the two-layer detector 501 on a plasma-exposed surface, the ions from the plasma enter the ion angle selection grid 511, as indicated by an arrow at the top of FIG. 6A. As explained above, the high aspect ratio openings of the ion angle selection grid 511 provides a sample of ions moving along trajectories with ion angles in a narrow band around a selected angle (e.g., a band width of 1° around 0°). Being exposed to plasma (box 642 in FIG. 6B), the ion angle selection grid 511 acquires a self-bias representative of the plasma potential. In this example embodiment, the self-bias potential is transmitted from the ion angle selection grid 511 to the detector electronic system 600 through a vacuum feedthrough (indicated schematically by feedthroughs 620). The detector electronic system 600 is configured to sense and use the self-bias potential of the ion angle selection grid 511 as the reference voltage for a variable voltage source 602, as illustrated in FIG. 6A and indicated in box 644 in FIG. 6B. The output of the variable voltage source 602 is shown in FIG. 6A to be coupled to the ion current collector 551, thereby biasing the ion current collector 551 with a first voltage relative to the reference voltage, as indicated in box 646 in FIG. 6B.

If the variable voltage source 602 is configured such that the polarity of the first voltage is negative relative to the reference voltage, all the ions in the selected angle window may reach the ion current collector 551 in a downward ion flux indicated by a downward arrow between the ion angle selection grid 511 and the ion current collector 551 in FIG. 6A. By reversing the polarity of the first voltage, the bias applied to the ion current collector 551 may repel a fraction of the ion flux that would be incident on the conductive plate of the ion current collector 551, as indicated by an upward arrow between the ion angle selection grid 511 and the ion current collector 551. The net flux arriving at the conductive plate of the ion current collector 551 produces a current to flow in the path connecting the ion current collector 551 to the variable voltage source 602.

An ammeter 612 is shown inserted in the current path between the ion current collector 551 and the variable voltage source 602 to measure the ion current produced by the net ion flux arriving at the ion current collector 551, as illustrated in FIG. 6A. Although FIG. 6A shows an ammeter, it is understood that the ion current collector current may be measured by an ion current sensing circuit designed to make a precise measurement of current. The current measurement step (box 648) provides a signal proportional to the ion flux that is communicated to a processor 610 of the detector electronic system 600.

The structure and operation of an embodiment of an integrated ion angle and energy detector has been described above using the two-layer detector 500/501 in FIGS. 5 and 6A, the detector electronic system 600, and a method of operation 650 illustrated by the flow diagram in FIG. 6B. The outcome of the measurement is a value of current that represents the integrated ion distribution function over a portion of the 2D angle-energy space selected jointly by the ion angle selection grid 510/511 and the first voltage applied to the ion current collector 550/551. The 2D joint angle-energy distribution function may be obtained by the two-layer detector 500/501 by varying the energy range by varying the first voltage, and by varying the selected ion angle range using methods and structures described further below. As explained above, the IEDF for a selected ion angle may be obtained by differentiating the respective ion current vs. first voltage characteristic.

Next, the structure and operation of a three-layer embodiment of an integrated ion angle and energy detector is described below using the three-layer detector 700/701 in FIGS. 7 and 8A, the detector electronic system 800, and a method of operation 850 illustrated by the flow diagram in FIG. 8B.

Figure 7:
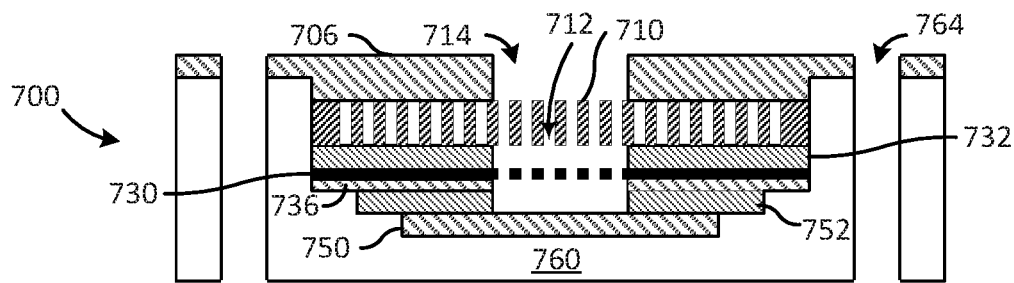
FIG. 7 illustrates a cross-sectional view of a three-layer detector, in accordance with an embodiment of the invention.

As illustrated in FIG. 7, in the three-layer detector 700, an ion energy selection grid 730 (similar to the ion energy selection grid 330 in FIG. 3) has been inserted between an ion angle selection grid 710 and an ion current collector 750. The three-layer embodiment is constructed by eliminating the first and second electron rejection grids 320 and 340 and associated conductive and insulating rings of the five-layer detector 300, described with reference to FIG. 3. The structure of the remaining components, such as the ion angle selection grid 710 with the high aspect ratio openings 712, the conductive 706 and 736, the insulating rings 732 and 752, the central opening 714 of the rings, and the fasteners openings 764, are similar to the respective components in five-layer detector 300.

Figure 8A:
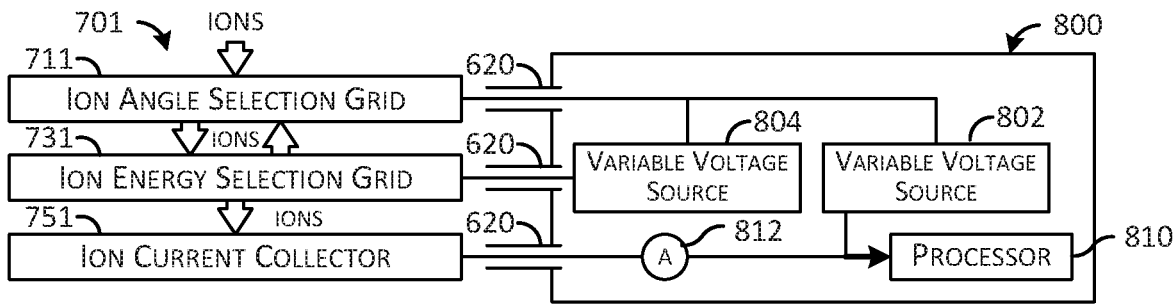
FIG. 8A illustrates a schematic representation of a three-layer detector with a detector electronic system configured to operate the three-layer detector.
Figure 8B:
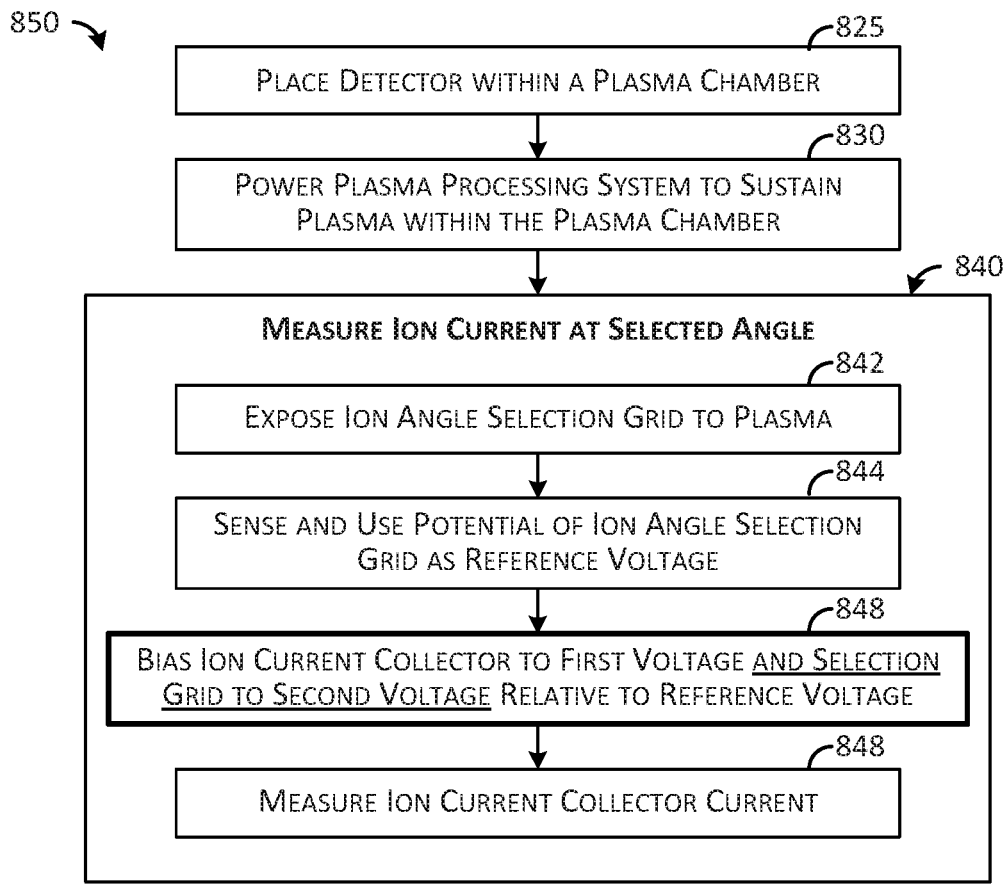
FIG. 8B is a flow diagram illustrating a method for operating the three-layer detector with the detector electronic system illustrated in FIG. 8A.

The three-layer detector 700 is illustrated by the schematic representation of a three-layer detector 701 in FIG. 8A. In FIG. 8A, a detector electronic system 800 is used to configure the three-layer detector 701. As illustrated in FIG. 8A, the detector electronic system 800 comprises two variable voltage sources, one more than in the detector electronic system 600. Another addition is an ion energy selection grid 731 inserted between an ion angle selection grid 711 and an ion current collector 751. Other components are similar to the respective components described with reference to the two-layer detector 501. The three-layer detector 701 and the detector electronic system 800 communicate via feedthroughs 620; the ion current from the ion current collector 751 may be sensed by an ammeter 812; and the measurement is communicated to a processor 810 for storage and analysis.

The method of operation 850 also mimics the method of operation 650 used to operate the two-layer detector 500/501. Same as for blocks 625 and 630, execution of blocks 820 and 830 positions the three-layer detector 700/701 on a plasma-exposed surface. The execution of the measurement block 840 is similar to that of block 640, but differs only at the bias configuration step 848. Both measurements expose the ion angle selector grid 710/711 to plasma (boxes 842 and 642); use the self-bias potential as the reference voltage (boxes 844 and 644); and measure the ion current collector 750/751 current (boxes 848 and 648). The difference between the two measurement methods is that, an additional voltage is used to configure the three-layer detector 700/701 (box 842). In addition to biasing the ion current collector 750/751 with a first voltage set by a first variable voltage source 802, a second variable voltage source 804 is used to bias the ion energy selection grid 730/731.

The first voltage (the bias for the ion current collector 750/751) is selected to always be a fixed negative value relative to the reference voltage (the self-bias potential of the ion angle selection grid 711). The second voltage (the bias for the ion energy selection grid 730/731) is used to select an energy range of the ions. Hence, the second voltage may be varied between negative (attracting ions) and positive (repelling ions) values relative to the reference voltage to control the minimum energy of ions passing through towards the ion current collector 750/751. However, in order to ensure that ions do not get repelled back by the ion current collector 750/751, the second voltage is always maintained at a positive polarity relative to the first voltage.

As explained above for the two-layer detector 500/501, the measured ion current of the three-layer detector 700/701 also represents the integrated ion distribution function over a portion of the 2D angle-energy space selected jointly by the ion angle selection grid 710/711 and the second voltage applied to the ion current collector 750/751. The 2D joint angle-energy distribution function may be obtained by the three-layer detector 700/701 by varying the energy range by varying the second voltage, and by varying the selected ion angle range using methods and structures described further below. As explained above, the IEDF for a selected ion angle may be obtained by differentiating the respective ion current vs. second voltage characteristic.

Figure 9A:
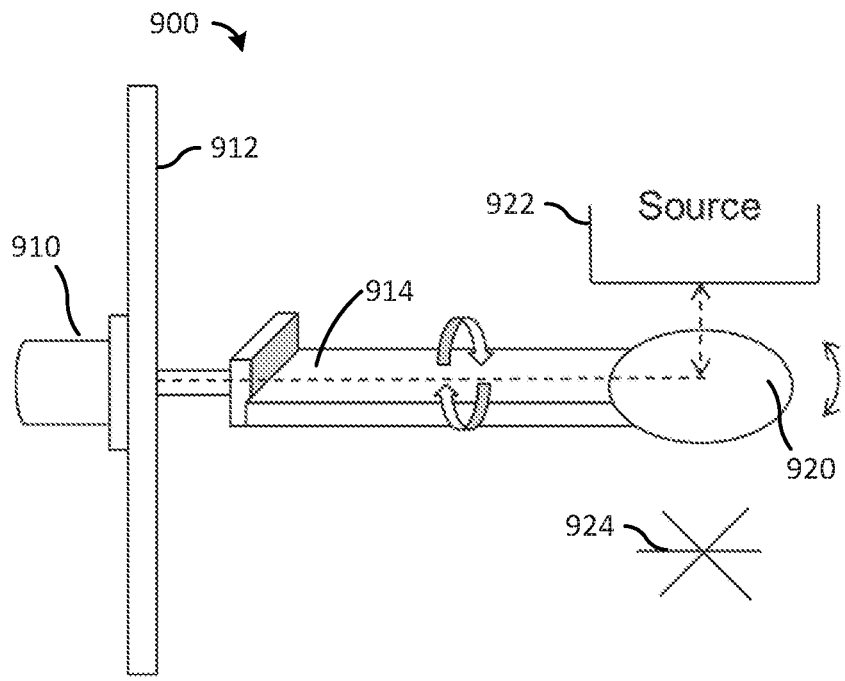
FIG. 9A illustrates a perspective view of a rotatable cantilever system, suitable for rotating a detector, in accordance with an embodiment of the invention.
Figure 9B:
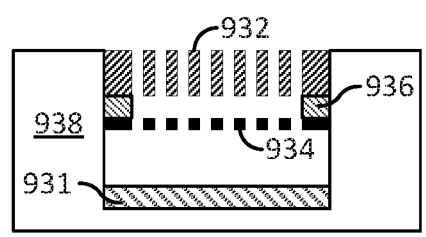
FIG. 9B shows cross-sectional views of a three-layer detector illustrating rotating the detector on an external pivot, in accordance with an embodiment of the invention.
Figure 9B:
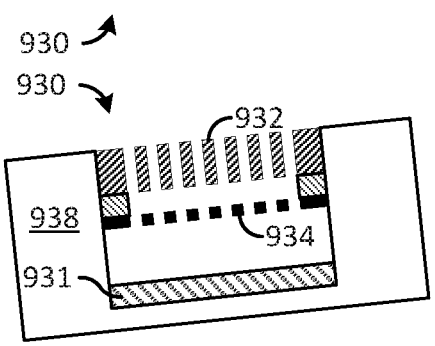
Figure 9C:
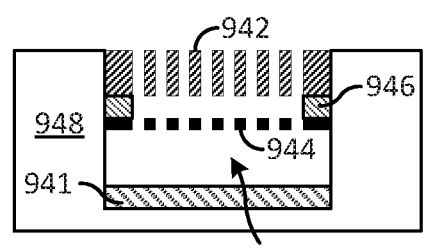
FIG. 9C shows cross-sectional views of a three-layer detector illustrating rotating the grids of a detector around an internal pivot, in accordance with an embodiment of the invention.
Figure 9C:
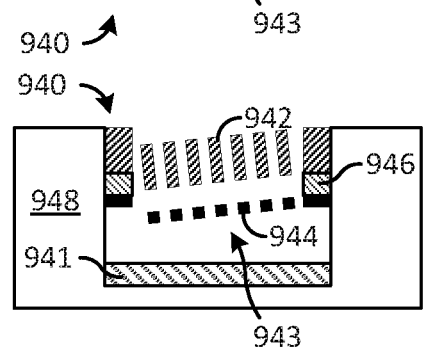

FIGS. 9A-9C illustrate embodiments where varying the selected ion angle involves physical rotational motion.

FIG. 9A illustrates a perspective view of a rotatable cantilever system 900, suitable for rotating a detector inside a plasma chamber. The rotatable cantilever system 900 comprises a cantilever beam 914 disposed inside a plasma chamber, and coupled to an electronically controllable motor 910 (e.g., a servo motor) outside the plasma chamber through a vacuum rotary feedthrough 912 affixed to a wall of the plasma chamber. A detector holder 920 is attached at the end of the cantilever beam 914, as illustrated in FIG. 9A. The angular position of the detector holder 920 may be aligned using, for example, a light source 922 and a photo-detector (e.g., a photodiode) 924, shown schematically in FIG. 9A.

A detector such as the three-layer integrated ion angle-energy detector 930, illustrated in FIG. 9B, may be placed on the detector holder 920. The ion angle selected by the ion angle selection grid 932 of the detector 930 may be varied by selecting an angular orientation of the detector holder 920 by rotating the cantilever beam 914 using the vacuum rotary feedthrough 912 and the electronically controllable motor 910. For example, the selected angle is zero degrees (vertical orientation) in the cross-sectional view of the three-layer detector 930 in the top portion of FIG. 9B. The selected angle has been changed by tilting the three-layer detector 930, as illustrated in the bottom portion of FIG. 9B. In this embodiment, all the components of the three-layer detector 930, such as the insulating substrate 938, the insulating ring 936, the ion energy selection grid 934, and the ion current collector 931 rotate along with the detector holder 920.

FIG. 9C illustrates another three-layer detector 940. In this embodiment, the cavity 943 in the insulating substrate 948 has been designed to have empty space for the ion angle selection grid 942 and the ion energy selection 944 to pivot around an internal hinge close to a sidewall of the cavity 943. The rotary motion and angular position of the ion angle selection grid 942 and the ion energy selection 944 may be set by electronically controllable actuators fabricated using MEMS technology and fabrication techniques.

Figure 10:
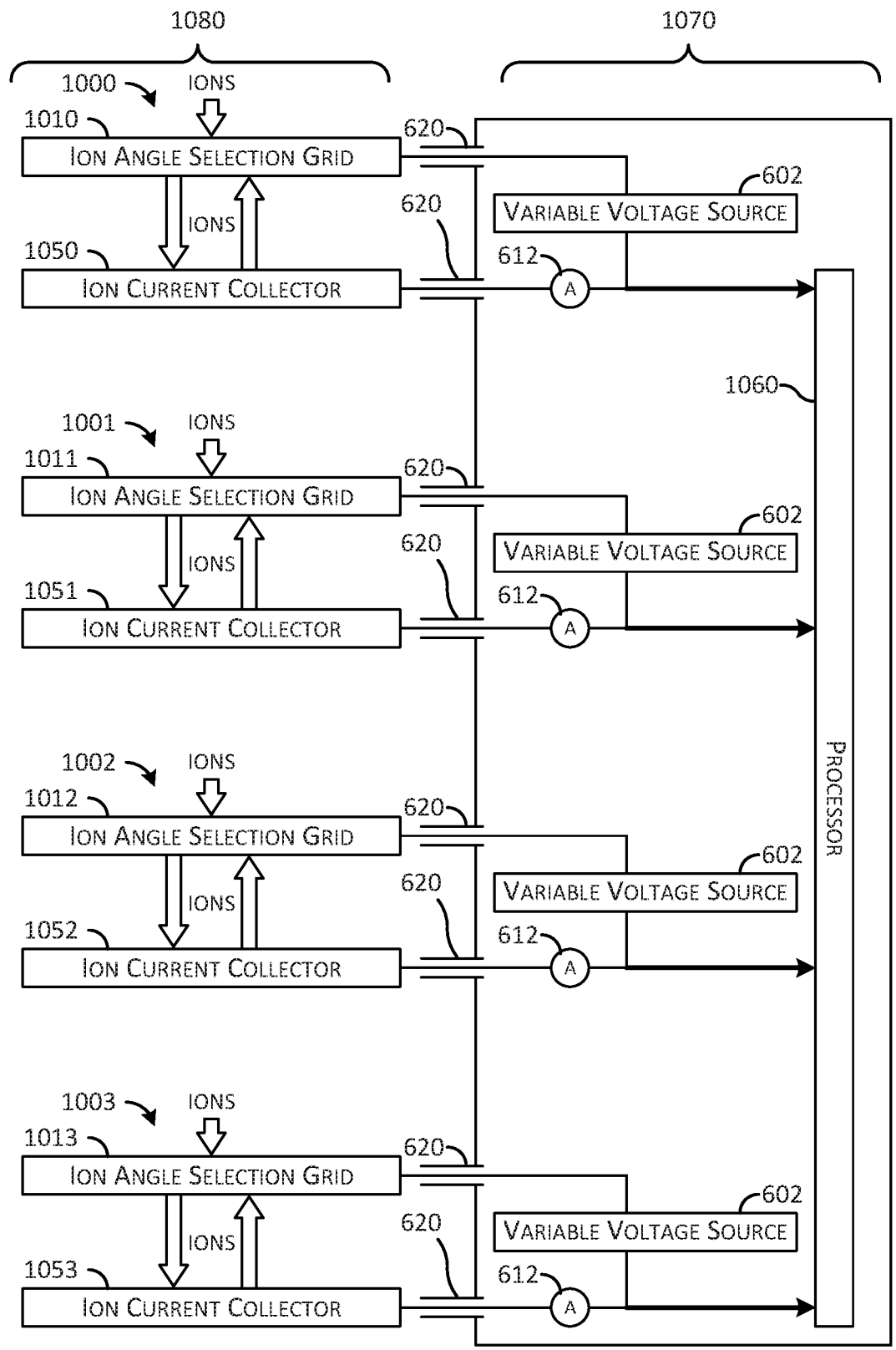
FIG. 10 illustrates a schematic representation of a plurality of two-layer detectors with a detector electronic system configured to operate the plurality of two-layer detectors, in accordance with an embodiment of the invention.

FIGS. 10-12 illustrate embodiments where various ion angle ranges of the 2D angle-energy space may be selected using multiple stationary angle selectors. Each angle selector would be obtaining measurements of ion currents in a different angle range using an independent ion current collector. The 2D ion distribution function may be obtained using computer-aided analysis of the combined data set. One advantage provided by these embodiments is that moving parts may be avoided in the measurement system used to obtain the ion angle and energy joint distribution function.

A 2D angle-energy joint distribution function of ions may be obtained by a measurement system using a plurality of integrated ion angle and energy detectors. FIG. 10 illustrates a schematic representation of a detector array 1080 comprising four two-layer detectors 1000, 1001, 1002, and 1003. The detectors of the detector array 1080 may be operated with a detector electronic system 1070. The design of the four two-layer detectors 1000, 1001, 1002, and 1003 are same in all respects except each of the ion angle selection grids 1010, 1011, 1012, and 1013 are of a unique design to select four different ion angle ranges. For example, the openings in all the ion angle selection grids may be oriented vertically, and may be of equal depth, but the width of the openings in any one of the ion angle selection grids 1010 1011, 1012, and 1013 may differ from that in the other three grids, thereby providing each grid with a unique aspect ratio. As mentioned above, the width of the ion angle range selected by a high aspect ratio opening is roughly inversely proportional to the aspect ratio.

Each of the two-layer detectors 1000, 1001, 1002, and 1003 may be configured in the same manner as described above for the two-layer detector 501 configured using the detector electronic system 600. One variable voltage source 602 may be used to bias one ion current collector using a first voltage, and the respective ion current measured using one ammeter 612. Accordingly, as illustrated in FIG. 10, the detector electronic system 1070 comprises four variable voltage sources 602 and four ammeters 612 coupled to the four ion current collectors 1050, 1051, 1052, and 1053 through the feedthroughs 620. The four ammeters 612 allow four independent measurements of ion current from the four ion current collectors 1050, 1051, 1052, and 1053. As explained above, the IEDF's of ions within a selected ion angle range, selected by the respective ion angle selection grid, may be obtained by varying the first voltage to vary the energy range of the ions contributing to the respective measured ion current. The array of four IEDF's may be stored and analyzed by a processor 1060 in FIG. 10 to provide the 2D angle-energy joint distribution function of ions.

The example measurement system, illustrated in FIG. 10, samples four ion angle ranges using a detector array 1080 comprising four detectors to illustrate the measurement technique. A larger array size may be used to achieve a better resolution in angle for the 2D angle-energy ion distribution function.

In the example described with reference to FIG. 10, the ion angle range selected by an ion angle selection grid has been varied by varying the aspect ratio of vertical grid openings. The selected angle range may also be altered by drilling the through openings of a grid along a direction tilted away from the vertical.

FIGS. 11A and 11B illustrate two example embodiments of two-layer detectors 1100 and 1150 using a composite ion angle selection grid. The two-layer detector 1100 is shown using a composite ion angle selection grid comprising three angle selectors 1102, 1104, and 1106, and detector 1150 is using a composite ion angle selection grid comprising three angle selectors 1103, 1105, and 1107. The three angle selectors in each detector are disposed below and coupled to a top conductive ring 1110. Each angle selector is disposed above a respective independent (electrically isolated) ion current collector. The three ion current collectors 1116, 1118, and 11120 and the angle selectors of each of the two-layer detectors 1100 and 1150 are electrically isolated using an insulating ring 1112 and an insulating substrate 1114. It is noted that the structure of a detector with N angle selectors (e.g., the two-layer detectors 1100 and 1150 with three angle selectors, illustrated in FIGS. 11A and 11B) is analogous to an array of N detectors, such as the detector array 1080 comprising four detectors, illustrated in FIG. 10.

The three angle selectors integrated in one detector are used to select three ion angle ranges and sample ions moving along a direction within the respective ion angle range. In the two-layer detector 1100 this is achieved by changing the aspect ratio of the through openings in the grid of an angle selector. Angle selector 1102 comprises vertical openings having a nominal aspect ratio, and angle selectors 1104 and 1106 comprise vertical openings with a lower and a higher aspect ratio, respectively, relative to the nominal aspect ratio of openings in angle selector 1102. In detector 1150, the ion angle range of a detector has been varied by altering the orientation of an axis along which the openings are directed. Angle selector 1102 comprises vertical openings, while angle selectors 1105 and 1107 comprise tilted openings. The tilt angle from the vertical is larger in angle selector 1107 relative to the tilt angle in angle selector 1105.

FIG. 12 illustrates the operation of a detector 1200 operated by a detector electronic system 1250 coupled to the detector 1200 through feedthroughs 1260. The ion flux through each angle selector 1211, 1215, and 1219 may produce an independently measurable ion current resulting from ions that arrive at the respective ion current collector. For example, the net ion flux from the angle selector 1211 produces an ion current in the ion current collector 1251 disposed below the angle selector 1211. The three ion current collectors 1251, 1253, and 1255 are independently biased with three first voltages from three variable voltage sources 1222, 12224, and 1226, respectively. As illustrated in FIG. 12, the three variable voltage sources 1222, 12224, and 1226 share a common reference voltage. The reference voltage is the self-bias potential of the angle selectors 1211, 1215, and 1219 when the angle selectors are exposed to plasma. Three independent ion currents from the three ion current collectors 1251, 1253, and 1255 may be measured using ammeters 1232, 1234, and 1236, respectively. The three bias voltages are selected and the three current measurements are received by a processor 1240.

As explained above in the description of the two-layer detector 500/501 with reference to FIGS. 5, 6A and 6B, the IEDF's of ions sampled by each angle selector may be obtained from an analysis of the response of ion current to a change in the first voltage performed by the processor 1240. The 2D ion angle-energy joint distribution function may be obtained by analyzing the collection of IEDF's.

Embodiments of integrated ion angle and energy have been disclosed and measurement methods have been described to obtain 2D ion angle and ion energy joint distribution function of ions in plasma used in plasma processing systems. Various structures and methods to change the selected ion angle range of detectors have been described with various example embodiments.

Example 1. A measurement system for a plasma processing system includes a detector, which includes an insulating substrate including a cavity, an ion angle selection grid configured to be exposed to a bulk plasma disposed in an upper portion of the cavity, the ion angle selection grid includes an ion angle selection substrate and a plurality of through openings extending through the ion angle selection substrate, where each of the plurality of through openings has a depth into the ion angle selection substrate and a width orthogonal to the depth, where a ratio of the depth to the width is greater than or equal to 40, and an ion current collector disposed within the cavity at an opposite side of the cavity below the ion angle selection grid; and an ion current meter coupled to the ion current collector and configured to provide a signal based on the measurements from the ion current collector.

Example 2. The measurement system of example 1, where, during operation of the measurement system, the insulating substrate is configured to be set at multiple positions that are tilted around an axis.

Example 3. The measurement system of one of examples 1 or 2, where, during operation of the measurement system, without rotating the insulating substrate, the ion angle selection grid and the ion current collector are configured to be set at multiple positions that are tilted around an axis.

Example 4. The measurement system of one of examples 1 to 3, where all of the plurality of through openings have the same width.

Example 5. The measurement system of one of examples 1 to 4, further includes an ion energy selection grid disposed between the ion angle selection grid and the ion current collector.

Example 6. The measurement system of one of examples 1 to 5, further includes a first electron rejection grid disposed between the ion angle selection grid and the ion energy selection grid.

Example 7. The measurement system of one of examples 1 to 6, further includes a second electron rejection grid disposed between the ion energy selection grid and the ion current collector.

Example 8. The measurement system of one of examples 1 to 7, further includes a plurality of detectors, where each of the plurality of detectors includes the insulating substrate, the ion current collector, and the ion angle selection grid, where, during the operation of the measurement system, the plurality of detectors are configured to be located at different spatial positions proximate to each other on a plasma-exposed surface within a plasma chamber, the plurality of detectors includes a first detector, where a dimension of all the through openings of the first detector are of a first value, and a second detector, where a dimension of all the through openings of the second detector are of a second value, the first value being different from the second value.

Example 9. The measurement system of one of examples 1 to 8, where all the through openings of the first detector have a first width, and where all the through openings of the second detector have a second width, where the first width is different from the second width.

Example 10. The measurement system of one of examples 1 to 9, where all the through openings of the first detector include first sidewalls tilted at a first angle relative to a central axis through the cavity, where all the through openings of the second detector include second sidewalls tilted at a second angle relative to the central axis through the cavity, and where the first angle is different from the second angle.

Example 11. The measurement system of one of examples 1 to 10, where the ratio of the depth to the width is between 40 and 200.

Example 12. The measurement system of one of examples 1 to 11, where the width of each of the plurality of through openings is less than the Debye length of the plasma.

Example 13. A measurement system for a plasma processing system includes a detector, which includes an insulating substrate including a cavity, a plurality of ion current collectors disposed in a bottom portion of the cavity, and an ion angle selection grid configured to be exposed to a plasma disposed within the cavity at an opposite side of the cavity above the plurality of ion current collectors, the ion angle selection grid includes an ion angle selection substrate and a plurality of through openings extending through the ion angle selection substrate, the plurality of through openings including a first opening disposed over a first collector of the plurality of ion current collectors and a second opening disposed over a second collector of the plurality of ion current collectors, the first opening having a different dimension than the second opening, where each of the plurality of through openings have a depth into the ion angle selection substrate and a width orthogonal to the depth, where a ratio of the depth to the width is greater than or equal to 40; and an ion current sensing circuit coupled to the plurality of ion current collectors and configured to provide a signal representative of an ion angle distribution function of the plasma.

Example 14. The measurement system of example 13, where the ion current sensing circuit includes a plurality of ion current meters, each of the plurality of ion current meters being coupled to a respective one of the plurality of ion current collectors; a processor; and a memory storing a program to be executed in the processor, the program includes instructions when executed cause the processor to compute the ion angle distribution function from the measurements of the plurality of ion current meters.

Example 15. The measurement system of one of examples 13 or 14, where the first opening has a first width at a major outer surface of the ion angle selection substrate, and where the second opening has a second width at a major outer surface of the ion angle selection substrate, where the first width is different from the second width.

Example 16. The measurement system of one of examples 13 to 15, where the first opening includes first sidewalls tilted at a first angle relative to a central axis through the cavity, where the second opening includes second sidewalls tilted at a second angle relative to the central axis through the cavity, and where the first angle is different from the second angle.

Example 17. The measurement system of one of examples 13 to 16, further includes an ion energy selection grid disposed between the ion angle selection grid and the plurality of ion current collectors.

Example 18. The measurement system of one of examples 13 to 17, further includes a first electron rejection grid disposed between the ion angle selection grid and the ion energy selection grid.

Example 19. The measurement system of one of examples 13 to 18, further includes a second electron rejection grid disposed between the ion energy selection grid and the plurality of ion current collectors.

Example 20. The measurement system of one of examples 13 to 19, where the ratio of the depth to the width is between 40 and 200.

Example 21. The measurement system of one of examples 13 to 20, where the width of each of the plurality of through openings is less than the Debye length of the plasma.

Example 22. The measurement system of one of examples 13 to 21, further includes a plurality of electrical conductive channels disposed in the insulating substrate, where each of the plurality of electrical conductive channels couples one of the plurality of ion current collectors to a respective ion current meter.

Example 23. A method of measuring an ion angle distribution of a plasma in a plasma processing system includes placing a detector within a plasma chamber of a plasma processing system, the detector includes a plurality of ion current collectors and an ion angle selection grid, the ion angle selection grid includes an ion angle selection substrate and a plurality of through openings extending through the ion angle selection substrate, the plurality of through openings including a first opening disposed over a first collector of the plurality of ion current collectors and a second opening disposed over a second collector of the plurality of ion current collectors, the first opening having a different dimension than the second opening, where each of the plurality of through openings has a depth into the ion angle selection substrate and a width orthogonal to the depth, where a ratio of the depth to the width is greater than or equal to 40; powering the plasma processing system to sustain a plasma within the plasma chamber; measuring a current distribution at each of the plurality of ion current collectors by exposing the ion angle selection grid to the plasma; sensing the potential of the ion angle selection grid as a reference voltage; biasing the plurality of ion current collectors to a first voltage relative to the reference voltage; and measuring an ion current at each of the plurality of ion current collectors.

Example 24. The method of example 23, further includes biasing an ion energy selection grid to a second voltage relative to the reference voltage, the ion energy selection grid being disposed between the ion angle selection grid and the plurality of ion current collectors.

Example 25. The method of one of examples 23 or 24, further includes biasing a first electron rejection grid disposed between the ion angle selection grid and the ion energy selection grid to a third voltage relative to the reference voltage.

Example 26. The method of one of examples 23 to 25, further includes biasing a second electron rejection grid disposed between the ion energy selection grid and the plurality of ion current collectors to a fourth voltage relative to the reference voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A measurement system for a plasma processing system, the measurement system comprising:
   a detector comprising:
      an insulating substrate comprising a cavity,
      an ion angle selection grid configured to be exposed to a bulk plasma disposed in an upper portion of the cavity, the ion angle selection grid comprising an ion angle selection substrate and a plurality of through openings extending through the ion angle selection substrate, wherein each of the plurality of through openings has a depth into the ion angle selection substrate and a width orthogonal to the depth, wherein a ratio of the depth to the width is greater than or equal to 40, and
      an ion current collector disposed within the cavity at an opposite side of the cavity below the ion angle selection grid; and
   an ion current meter coupled to the ion current collector and configured to provide a signal based on the measurements from the ion current collector.

2. The measurement system of claim 1, wherein, during operation of the measurement system, the insulating substrate is configured to be set at multiple positions that are tilted around an axis.

3. The measurement system of claim 1, wherein, during operation of the measurement system, without rotating the insulating substrate, the ion angle selection grid and the ion current collector are configured to be set at multiple positions that are tilted around an axis.

4. The measurement system of claim 1, wherein all of the plurality of through openings have the same width.

5. The measurement system of claim 1, further comprising an ion energy selection grid disposed between the ion angle selection grid and the ion current collector.

6. The measurement system of claim 5, further comprising a first electron rejection grid disposed between the ion angle selection grid and the ion energy selection grid.

7. The measurement system of claim 6, further comprising a second electron rejection grid disposed between the ion energy selection grid and the ion current collector.

8. The measurement system of claim 1, further comprising a plurality of detectors, wherein each of the plurality of detectors comprises the insulating substrate, the ion current collector, and the ion angle selection grid, wherein, during the operation of the measurement system, the plurality of detectors are configured to be located at different spatial positions proximate to each other on a plasma-exposed surface within a plasma chamber, the plurality of detectors comprising a first detector, wherein a dimension of all the through openings of the first detector are of a first value, and a second detector, wherein a dimension of all the through openings of the second detector are of a second value, the first value being different from the second value.

9. The measurement system of claim 8, wherein all the through openings of the first detector have a first width, and wherein all the through openings of the second detector have a second width, wherein the first width is different from the second width.

10. The measurement system of claim 1, wherein all the through openings of the first detector comprise first sidewalls tilted at a first angle relative to a central axis through the cavity, wherein all the through openings of the second detector comprise second sidewalls tilted at a second angle relative to the central axis through the cavity, and wherein the first angle is different from the second angle.

11. The measurement system of claim 1, wherein the ratio of the depth to the width is between 40 and 200.

12. A measurement system for a plasma processing system, the measurement system comprising:
   a detector comprising:
      an insulating substrate comprising a cavity,
      a plurality of ion current collectors disposed in a bottom portion of the cavity, and
      an ion angle selection grid configured to be exposed to a plasma disposed within the cavity at an opposite side of the cavity above the plurality of ion current collectors, the ion angle selection grid comprising an ion angle selection substrate and a plurality of through openings extending through the ion angle selection substrate, the plurality of through openings comprising a first opening disposed over a first collector of the plurality of ion current collectors and a second opening disposed over a second collector of the plurality of ion current collectors, the first opening having a different dimension than the second opening, wherein each of the plurality of through openings have a depth into the ion angle selection substrate and a width orthogonal to the depth, wherein a ratio of the depth to the width is greater than or equal to 40; and
   an ion current sensing circuit coupled to the plurality of ion current collectors and configured to provide a signal representative of an ion angle distribution function of the plasma.

13. The measurement system of claim 12, wherein the ion current sensing circuit comprises:
   a plurality of ion current meters, each of the plurality of ion current meters being coupled to a respective one of the plurality of ion current collectors;
   a processor; and
   a memory storing a program to be executed in the processor, the program comprising instructions when executed cause the processor to compute the ion angle distribution function from the measurements of the plurality of ion current meters.

14. The measurement system of claim 12, wherein the first opening has a first width at a major outer surface of the ion angle selection substrate, and wherein the second opening has a second width at a major outer surface of the ion angle selection substrate, wherein the first width is different from the second width.

15. The measurement system of claim 12, wherein the first opening comprises first sidewalls tilted at a first angle relative to a central axis through the cavity, wherein the second opening comprises second sidewalls tilted at a second angle relative to the central axis through the cavity, and wherein the first angle is different from the second angle.

16. The measurement system of claim 12, further comprising an ion energy selection grid disposed between the ion angle selection grid and the plurality of ion current collectors.

17. The measurement system of claim 12, wherein the ratio of the depth to the width is between 40 and 200.

18. The measurement system of claim 12, further comprising a plurality of electrical conductive channels disposed in the insulating substrate, wherein each of the plurality of electrical conductive channels couples one of the plurality of ion current collectors to a respective ion current meter.

19. A method of measuring an ion angle distribution of a plasma in a plasma processing system, the method comprising:
placing a detector within a plasma chamber of a plasma processing system, the detector comprising a plurality of ion current collectors and an ion angle selection grid, the ion angle selection grid comprising an ion angle selection substrate and a plurality of through openings extending through the ion angle selection substrate, the plurality of through openings comprising a first opening disposed over a first collector of the plurality of ion current collectors and a second opening disposed over a second collector of the plurality of ion current collectors, the first opening having a different dimension than the second opening, wherein each of the plurality of through openings has a depth into the ion angle selection substrate and a width orthogonal to the depth, wherein a ratio of the depth to the width is greater than or equal to 40;
powering the plasma processing system to sustain a plasma within the plasma chamber; and
measuring a current distribution at each of the plurality of ion current collectors by
exposing the ion angle selection grid to the plasma;
sensing the potential of the ion angle selection grid as a reference voltage;
biasing the plurality of ion current collectors to a first voltage relative to the reference voltage; and
measuring an ion current at each of the plurality of ion current collectors.

20. The method of claim 19, further comprising:
biasing an ion energy selection grid to a second voltage relative to the reference voltage, the ion energy selection grid being disposed between the ion angle selection grid and the plurality of ion current collectors.

* * * * *